(12) United States Patent
Rolland et al.

(10) Patent No.: US 7,029,832 B2
(45) Date of Patent: Apr. 18, 2006

(54) IMMERSION LITHOGRAPHY METHODS USING CARBON DIOXIDE

(75) Inventors: Jason P. Rolland, Chapel Hill, NC (US); Joseph P. DeSimone, Chapel Hill, NC (US)

(73) Assignee: Samsung Electronics Co., Ltd., (KR)

( * ) Notice: Subject to any disclaimer, the term of this patent is extended or adjusted under 35 U.S.C. 154(b) by 229 days.

(21) Appl. No.: 10/386,356

(22) Filed: Mar. 11, 2003

(65) Prior Publication Data

US 2004/0180299 A1  Sep. 16, 2004

(51) Int. Cl.
*G03F 7/00* (2006.01)

(52) U.S. Cl. ..................... 430/322; 430/311

(58) Field of Classification Search ........... 430/311, 430/313, 322, 323, 325, 331
See application file for complete search history.

(56) References Cited

U.S. PATENT DOCUMENTS

| | | | | |
|---|---|---|---|---|
| 5,121,256 | A * | 6/1992 | Corle et al. ............... | 359/664 |
| 5,900,354 | A * | 5/1999 | Batchelder ............... | 430/395 |
| 6,358,673 | B1 * | 3/2002 | Namatsu ................... | 430/311 |
| 6,509,138 | B1 * | 1/2003 | Gleason et al. ........... | 430/313 |
| 6,683,008 | B1 * | 1/2004 | Cotte et al. ............... | 438/745 |
| 2002/0163629 | A1 | 11/2002 | Switkes et al. ............ | 355/53 |

FOREIGN PATENT DOCUMENTS

| | | |
|---|---|---|
| JP | 2000085025 | 3/2000 |
| WO | WO 99/01797 A1 | 1/1999 |
| WO | WO 00/17712 A1 | 3/2000 |
| WO | WO 00/67072 A1 | 11/2000 |

OTHER PUBLICATIONS

Switkes M., et al., "Resolution Enhancement of 157 NM Lithography by Liquid Immersion," *Proceedings of the SPIE*, SPIE, Bellingham, VA, vol. 4691, Mar. 2, 2002, pp. 459-465.
Switkes M, et al., "Immersion Liquids for Lithography in the Deep Ultraviolet," *Proceedings of SPIE*, vol. 5040, Feb. 25, 2003, pp. 690-699.
Copy of International Search Report for PCT/US2004/003556.
*What's next: Full immersion lithography?*, Solid State Technology, vol. 45, No. 5, May 2002, p. 24.
LaPedus, '*Liquid immersion*' *could delay post-optical lithography, says MIT*, Semiconductor Business News, Mar. 2, 2002, 2 pp.
Switkes et al., *Immersion lithography at 157 nm*, J. Vac. Sci. Technol. B, vol. 19, No. 6, Nov./Dec. 2001, pp. 2353-2356.
Hyatt, *Liquid and Supercritical Carbon Dioxide as Organic Solvents*, J. Org. Chem., vol. 49, 1984, pp. 5097-5101.

* cited by examiner

*Primary Examiner*—Kathleen Duda
(74) *Attorney, Agent, or Firm*—Myers Bigel Sibley & Sajovec

(57) ABSTRACT

A substrate is patterned by performing immersion lithography on a photoresist layer on the substrate using carbon dioxide. The immersion layer may be provided and/or removed and/or the photoresist layer may be developed, dried and/or removed using carbon dioxide. The immersion layer can include liquid and/or solid immersion layers. The need for organic solvents in immersion lithography can thereby be reduced or eliminated.

47 Claims, 3 Drawing Sheets

IMMERSION LITHOGRAPHY METHODS USING CARBON DIOXIDE

FIELD OF THE INVENTION

The present invention relates to methods of patterning a photoresist layer on a substrate as well as methods of removing an immersion layer from a photoresist layer.

BACKGROUND OF THE INVENTION

To satisfy the ever-increasing desire for faster and smaller electronic devices such as personal computers, it has become desirable to increase the number of microelectronic devices such transistors on a chip without increasing the size of the chip. Accordingly, it is desirable to continually strive to reduce the size of the microelectronic devices.

One of the primary hurdles in achieving the much sought after size reduction of microelectronic devices is in the area of photolithography. For decades, photolithography has been utilized to pattern photoresists in the manufacture of microelectronic devices. The resolution of the image formed on a photoresist layer using photolithography generally is directly proportional to the wavelength of the radiation source ($\lambda$) and inversely proportional to the numerical aperture (NA) of the photolithography apparatus. Thus, in order to reduce the feature size that can be patterned by a photolithography apparatus, it may be desirable to utilize radiation sources having shorter and shorter wavelengths and/or develop photolithography apparatus having larger numerical apertures.

Efforts have resulted in the reduction in wavelength from mercury g line (436 nm) to 193 nm using an excimer laser and further to 157 nm. Research is currently being performed to further reduce the wavelength of the radiation source using x-ray lithography and/or extreme ultraviolet (EUV) lithography. The cost of continuing to reduce the wavelength of the radiation source may be enormous. New materials for photomasks and/or lenses may need to be developed. As the wavelength becomes shorter, the photolithography method may need to shift from refractive photolithography to reflective photolithography. Designing an all-reflective camera that achieves lithographic-quality imaging may be more difficult than designing a refractive imaging system because mirrors generally have fewer degrees of freedom to vary than do lenses.

These challenges have resulted in an interesting intersection between microelectronic device manufacture and biology. When faced with the problem of increasing the resolution of microscope lenses beyond their normal magnification, biologists began placing a layer of oil between the lens and the slide to be examined. This technique, known as immersion oil microscopy, reduces the loss of image quality that would occur as a result of the difference in the refractive index between the glass of the lens and air. In an ideal situation, the refractive index of the oil is precisely matched to that of the glass so that the loss of image quality can be eliminated.

Using the principles of immersion oil microscopy, photolithographers have begun to explore an area that is coming to be known as immersion lithography. In immersion lithography, the space between the final optical element and the substrate to be patterned is at least partially filled with a high index medium. M. Switkes & M. Rothschild, "Immersion Lithography at 157 nm," J. Vac. Sci. Technol. B, 19(6): 2353–2356 (November/December 2001) proposes the use of commercially available perfluoropolyethers (PFPE's), which are widely available as oils and lubricants, for example under the trade name Fomblin® (Solvay Solexis Corp.) as the high index medium in an immersion interference lithography system. Switkes & Rothschild utilized organic solvents such as Fomblin® PFS-1 to remove them from the patterned substrate. The Switkes & Rothschild publication is hereby incorporated herein by reference in its entirety as if set forth fully herein.

Immersion lithography has been regarded as a breakthrough technology that may allow the integration density of integrated circuit devices to continue to increase without the need for post-optical next generation lithography. See, for example, the publication entitled "'Liquid Immersion' could delay post-optical lithography, says MIT", by Mark LaPedus, Semiconductor Business News, Mar. 11, 2002, and the publication entitled "What's Next: Full Immersion Lithography?" Solid State Technology, May 2002, Vol. 45, No. 5, p. 24.

SUMMARY OF THE INVENTION

Embodiments of the present invention provide methods of patterning a substrate by performing immersion lithography on a photoresist layer on the substrate using carbon dioxide. It has been found, according to some embodiments of the present invention, that supercritical and/or liquid carbon dioxide may be used at various steps in an immersion lithography process and, thereby, replace the use of some or all solvents that have been heretofore been used to deposit the immersion fluid, to remove the immersion fluid and/or to perform various other steps in immersion lithography. The use of organic solvents in immersion photolithography may have a large environmental and/or economic impact on the immersion lithography process. In contrast, embodiments of the invention can reduce or eliminate the need for such organic solvents.

In some embodiments of the present invention, immersion lithography is performed on a photoresist layer on a substrate by providing an immersion layer on the photoresist layer, imaging the photoresist layer through the immersion layer, removing the immersion layer from the photoresist layer, developing the photoresist layer from which the immersion layer has been removed, drying the photoresist layer from which the immersion layer has been removed, patterning the substrate using the photoresist layer that has been developed and removing the photoresist layer from the substrate that has been patterned. According to embodiments of the present invention, one or more of the steps of providing an immersion layer, removing the immersion layer, developing the photoresist layer, drying the photoresist layer and removing the photoresist layer is performed using carbon dioxide.

In some embodiments, carbon dioxide is used in providing an immersion layer on the photoresist layer. In some embodiments, a fluid layer is deposited onto the photoresist layer, wherein the fluid layer comprises carbon dioxide and at least one immersion compound. At least some of the carbon dioxide is then removed from the fluid layer to provide an immersion fluid layer on the photoresist layer.

In other embodiments, carbon dioxide is used to remove an immersion layer from a photoresist layer. In some of these embodiments, an immersion layer is formed on the photoresist layer and the photoresist layer is imaged through the immersion layer. The immersion layer is removed from the imaged photoresist by contacting the immersion layer with an immersion rinse composition that comprises liquid and/or supercritical carbon dioxide.

In still other embodiments, carbon dioxide is used to dry a photoresist layer. In some embodiments, an immersion layer is formed on the photoresist layer, the photoresist layer is imaged through the immersion layer and the immersion layer is removed from the photoresist layer. The photoresist layer from which the immersion layer has been removed is dried using liquid and/or supercritical carbon dioxide.

In yet other embodiments, carbon dioxide is used to develop the photoresist layer. In particular, in some embodiments, an immersion layer is formed on the photoresist layer, the photoresist layer is imaged through the immersion layer and the immersion layer is removed from the photoresist layer. The photoresist layer from which the immersion layer has been removed is developed using liquid and/or supercritical carbon dioxide. In other embodiments, the immersion layer is removed from the photoresist layer and the photoresist layer is simultaneously developed using liquid and/or supercritical carbon dioxide.

In still other embodiments of the present invention, carbon dioxide is used to remove the photoresist layer and/or clean the substrate after the substrate has been patterned. In particular, in some embodiments, an immersion layer is formed on the photoresist layer, the photoresist layer is imaged through the immersion layer and the immersion layer is removed from the photoresist layer. The photoresist layer from which the immersion layer has been removed is developed and the substrate is patterned using the photoresist layer that has been developed. The photoresist layer is then removed from the substrate that has been patterned using liquid and/or supercritical carbon dioxide.

In still other embodiments, a solid immersion film is placed on (contacted to) the photoresist layer and the photoresist layer is imaged through the solid immersion film. In some embodiments, the solid immersion film includes carbon dioxide and at least one solid immersion film compound. However, in other embodiments, the solid immersion film need not comprise carbon dioxide. Moreover, in still other embodiments, an immersion fluid layer is first formed on the photoresist layer and the solid immersion film is then placed on the immersion fluid layer opposite the photoresist layer. The immersion fluid layer between the solid immersion film and the photoresist layer can improve the contact between the solid immersion film and the photoresist layer. The immersion fluid layer may include carbon dioxide in some embodiments, but need not include carbon dioxide in other embodiments. Thus, some embodiments of the present invention provide the use of solid immersion films, also referred to herein as contact immersion films, in immersion lithography, with or without an intervening immersion fluid layer.

DETAILED DESCRIPTION OF PREFERRED EMBODIMENTS

Figure 1:
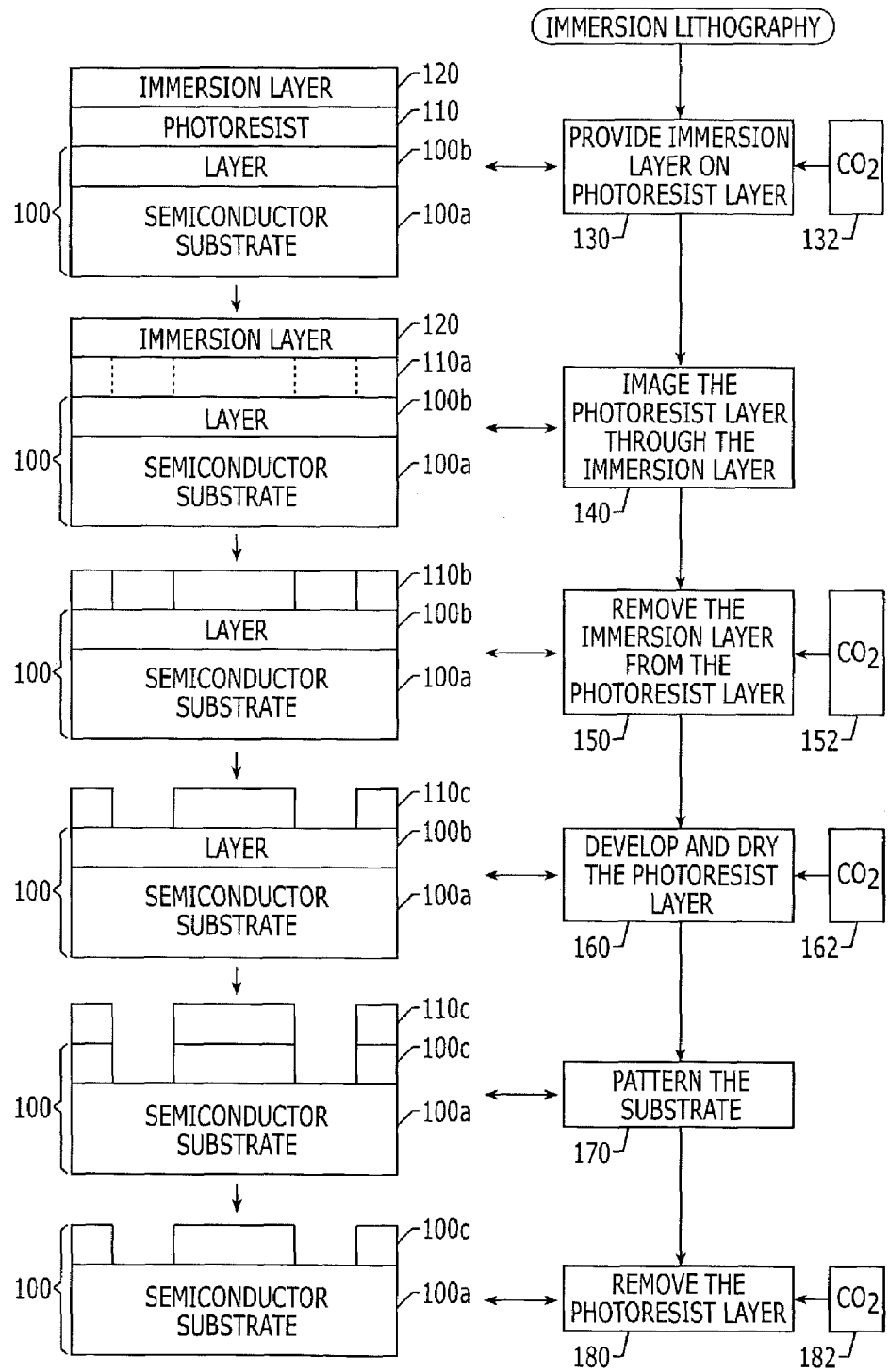
FIG. 1 is a flowchart of methods of patterning a substrate according to various embodiments of the present invention, and includes cross-sectional views of substrates that are patterned according to various embodiments of the present invention corresponding to blocks of the flowchart.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

FIG. 1 is a flowchart of methods of patterning a substrate according to embodiments of the present invention, and includes cross-sectional views of substrates that are patterned according to various embodiments of the present invention corresponding to blocks of the flowchart. Referring now to FIG. 1, a substrate is patterned according to embodiments of the present invention by performing immersion lithography on a photoresist layer on a substrate using carbon dioxide. As shown in FIG. 1, the substrate 100 may comprise a semiconductor substrate 100a and may also include one or more layers 100b on the semiconductor substrate 100a. As is well known to those having skill in the art, the semiconductor substrate 100a may include a monocrystalline, single element and/or compound semiconductor substrate and/or a monocrystalline, single element and/or compound semiconductor layer, such as an epitaxial layer, thereon. The layer 100b may include one or more insulating layers such as silicon dioxide, silicon nitride and/or other conventional insulating layers, one or more conductive layers, such as a metal and/or doped polysilicon layer and/or any other conventional layer that is used microelectronic device manufacturing. In order to pattern the substrate 100 including patterning the semiconductor substrate 100a and/or patterning a layer 10b, a photoresist layer 110 is provided on a substrate 100, using conventional techniques.

Referring to Block 130, an immersion layer 120, also referred to herein as an immersion fluid layer, is provided on the photoresist layer 110. In some embodiments of the invention, the immersion layer 120 is provided using carbon dioxide 132 by depositing a fluid layer onto the photoresist layer 110, the fluid layer comprising carbon dioxide and at least one immersion compound. At least some of the carbon dioxide is then removed from the fluid layer to provide an immersion fluid layer 120 on the photoresist layer 110. In some embodiments, the fluid layer comprises liquid and/or supercritical carbon dioxide. In other embodiments, the at least one immersion fluid compound comprises a fluorine and/or silicon containing compound such as a perfluoropolyether compound. In other embodiments, the at least one immersion fluid compound comprises a polymer. Many examples will be provided below.

Referring again to FIG. 1, at Block 140, the photoresist layer is imaged through the immersion layer to produce an imaged photoresist layer 110a. Imaging may be performed using known immersion lithography processes, such as described in the above-cited Switkes & Rothschild publication. Then, at Block 150, the immersion layer 120 is removed from the imaged photoresist layer 110a. In some embodiments, $CO_2$ 152 is used during the process of removing the immersion layer 120 from the imaged photoresist layer 110a at Block 150. In particular, in some embodiments, the immersion layer is contacted with an immersion rinse composition comprising liquid and/or supercritical carbon dioxide as will be described in detail below.

Referring again to FIG. 1, at Block 160, the photoresist layer 110b is developed and dried to produce a patterned photoresist layer 10c. In some embodiments, $CO_2$ 162 is used during the process of developing and/or drying the photoresist layer. In particular, in some embodiments, the photoresist layer from which the immersion layer has been removed is dried using liquid and/or supercritical carbon dioxide. In still other embodiments, the photoresist layer from which the immersion layer has been removed is developed using liquid and/or supercritical carbon dioxide 162. In yet other embodiments, carbon dioxide is used to develop and dry the photoresist layer. In still other embodiments, carbon dioxide is used to simultaneously develop and dry the photoresist layer. Techniques for drying and/or developing photoresist using carbon dioxide are known to those having skill in the art and need not be described further herein.

Referring again to FIG. 1, at Block 170, the substrate is patterned using conventional patterning techniques such as wet and/or dry etching. A patterned layer 100c is thereby produced. Then, at Block 180, the patterned photoresist layer 110c is removed. In some embodiments of the invention, liquid and/or supercritical carbon dioxide is used to remove the patterned photoresist layer 110c from the substrate 100. Techniques for removing photoresist using carbon dioxide are known to those having skill in the art and need not be described further herein.

Figure 2A:
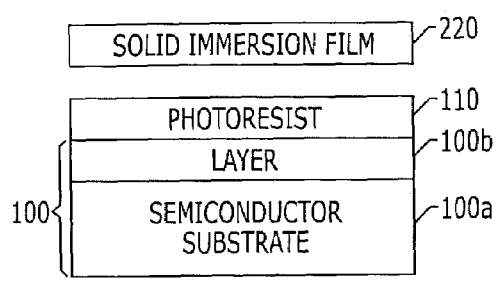
FIGS. 2A–2B are cross-sectional views of substrates that are patterned according to other embodiments of the present invention.
Figure 2B:
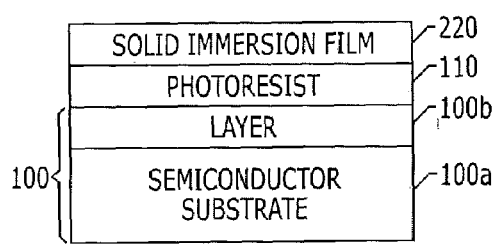

FIGS. 2A–2B are cross-sectional views illustrating other embodiments of providing an immersion layer on a photoresist layer (Block 130 of FIG. 1) according to the present invention. As shown in FIG. 2A, a solid immersion film 220 is placed on (contacted to) the photoresist layer 110 to form a solid immersion film, as shown in FIG. 2B. The composition of the solid immersion film 220 will be described below. The solid immersion film 220 may be attached using standard techniques for placing a solid thin film on a substrate. In some embodiments, the solid immersion film 220 comprises carbon dioxide and at least one solid immersion film compound. Then, as was described above in connection with Block 130, the carbon dioxide is removed from the solid immersion film. In other embodiments, a solid immersion film may be used to pattern a substrate in an immersion lithography process without using $CO_2$. Accordingly, solid immersion lithography may be provided, with or without using carbon dioxide in the process.

Figure 3A:
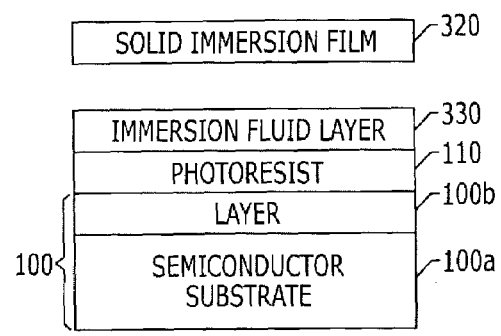
FIGS. 3A–3B are cross-sectional views of substrates that are patterned according to yet other embodiments of the present invention.
Figure 3B:
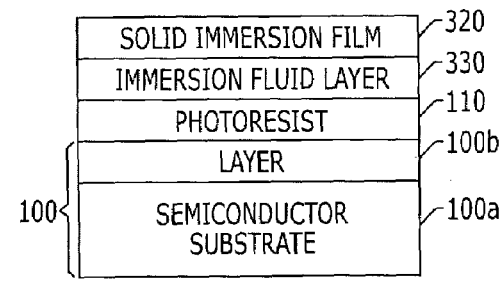

FIGS. 3A–3B are cross-sectional views of immersion lithography processes according to yet other embodiments of the present invention. In these embodiments, an immersion fluid layer 330 is interposed between the solid immersion film 320, which may be similar to the solid immersion film 220 of FIG. 2A, and the photoresist 110, to promote enhanced contact and/or a more uniform optical interface between the solid immersion film 320 and the photoresist 110. FIG. 3B illustrates a solid immersion film 320 on the photoresist 110 with an immersion fluid layer 330 therebetween. In some embodiments, the solid immersion film 320 is substantially thicker than the immersion fluid layer 320, so that the immersion lithography parameters are governed primarily by the solid immersion film 320. In other embodiments, differing thickness ratios may be used. In still other embodiments, the use of a solid immersion film 320 and a liquid immersion layer 330 may be used in immersion lithography processes that do not involve $CO_2$. It will be understood that conventional immersion lithography and/or immersion lithography of FIG. 1 may then be performed on embodiments of FIGS. 2B and/or 3B.

Additional discussion of various embodiments of the present invention now will be described.

According to some embodiments of the present invention, a method of patterning a photoresist layer on a substrate includes depositing a fluid layer, which includes carbon dioxide and at least one immersion compound, onto the photoresist layer and removing the carbon dioxide from the fluid layer to provide an immersion fluid layer on the photoresist layer.

The fluid layer may be deposited on the photoresist layer by various processes as will be understood by those skilled in the art. For example, in some embodiments, the immersion fluid is spin coated on the substrate. In other embodiments, the immersion fluid dissolved in a solvent is spin coated on the substrate, wherein the solvent comprises $CO_2$. In other embodiments, a free meniscus coating method such as dip coating and/or knife coating may be used.

The carbon dioxide may be in a liquid, gaseous, or supercritical phase. If liquid $CO_2$ is used, the temperature employed during the process is below 31° C. in some embodiments. If gaseous $CO_2$ is used, the phase may be employed at high pressure. As used herein, the term "high pressure" generally refers to $CO_2$ having a pressure from about 50 to about 500 bar. In some embodiments, the $CO_2$ is utilized in a "supercritical" phase. As used herein, "supercritical" means that a fluid medium is above its critical temperature and pressure, i.e., about 31° C. and about 71 bar for $CO_2$. The thermodynamic properties of $CO_2$ are reported in Hyatt, *J. Org. Chem.* 49: 5097–5101 (1984); therein, it is stated that the critical temperature of $CO_2$ is about 31° C.; thus in some embodiments of the present invention may be carried out at a temperature above 31° C. For the purposes of the invention, $CO_2$ at a pressure ranging from at a lower end of about 20 or about 50 bar to an upper end of about 200 bar or about 1000 bar may be employed.

The immersion fluid compound may be selected from various immersion fluid compounds including, but not limited to, perfluoropolyethers and other suitable fluorinated compounds. Other suitable fluorinated compounds may include fluoroalkyl (meth)acrylate homo- and copolymers, homo- and copolymers of tetrafluoroethylene, hexafluoropropylene, perfluorodimethydioxole, norbornene, vinylidine fluoride and norbornene derivatives, as described for example in published International Patent Application Nos. WO 00/17712 and WO 00/67072. The material also may contain silicon or siloxane units such as polydimethysiloxane or polydialkylsilanes. These materials may be $CO_2$ soluble, so that they can be soluble deposited in $CO_2$. In general, the immersion fluid compound should be transparent enough to allow a working distance between a final optical element and a microelectronic workpiece of at least 10 μm. The immersion fluid compound should not interact with the photoresist such that it would impede image formation. In addition, the immersion fluid compound should be compatible with the clean room environment and the semiconductor manufacturing process. In some embodiments, the immersion fluid compound is nontoxic and/or is chemically inert.

In other embodiments, the immersion fluid may also take the form of a contact film of a high transparency material that may be derived from the materials listed above, including a crosslinked material such as a crosslinked PFPE film. In still other embodiments, the immersion fluid may take the form of a contact film as described above, and an interposed liquid immersion layer of the type described above.

In some embodiments, the immersion fluid compound is resistant to damage by radiation (e.g., lasers) from sources that are used for photolithography. The resistance of the immersion fluid compound to damage by radiation sources can be determined by measuring the change in transmission for the compound following exposure to the radiation source of interest. For example, a layer of the immersion fluid compound can be placed between two $CaF_2$ windows and irradiated at 157 nm using a standard dose, such as 100 J/cm at a fluence of 0.3 $mJ/cm^2$-pulse and the change in transmission measured for the compound. In some embodiments, particularly those in which the immersion fluid compound is to be used for multiple exposures, the change in transmission may be less than 50 percent and in pother embodiments may be less than 25 percent. While the immersion fluid compound is preferably resistant to damage by the radiation source of interest, immersion fluid compounds of the present invention may still be utilized if they are easily damaged by the radiation source of interest. In these cases, the immersion fluid compound can be replaced after 1, 2, 3, 4, or 5 exposures. For example, an immersion fluid compound that is easily damaged by the radiation source of interest could travel with the wafer, providing fresh immersion fluid compound for each exposed field.

The carbon dioxide can be removed from the fluid layer to provide the immersion fluid layer by various processes as will be understood by those skilled in the art including, but not limited to, reducing the pressure of the fluid layer and/or increasing the temperature of the fluid layer. Because the microelectronic workpiece typically has a thermal budget, it may be desirable in some embodiments to remove the carbon dioxide from the fluid layer by reducing the pressure of the fluid layer.

In some embodiments, the refractive index of the immersion fluid layer should be within 10 to 20 percent of the refractive index for the optics of the imaging apparatus. For example, if $CaF_2$ optics (n=1.56, where n is the refractive index) are used in the imaging apparatus, the immersion fluid compound can have a refractive index between a lower limit of 1.25 or 1.40 and an upper limit of 1.72 or 1.87.

In some embodiments, methods of patterning a photoresist layer according to the present invention include placing the substrate having a photoresist layer thereon into a carbon dioxide chamber prior to the depositing of the immersion fluid layer. The carbon dioxide chamber is a chamber that can withstand the pressures and temperatures for processing with liquid or supercritical carbon dioxide, as described above. The carbon dioxide chamber may be on a track. As is well known to those having skill in the art, microelectronic devices may be fabricated using an ensemble of tools on a track. A $CO_2$ chamber can be added to the track to perform immersion lithography according to some embodiments of the present invention.

Figure 5:
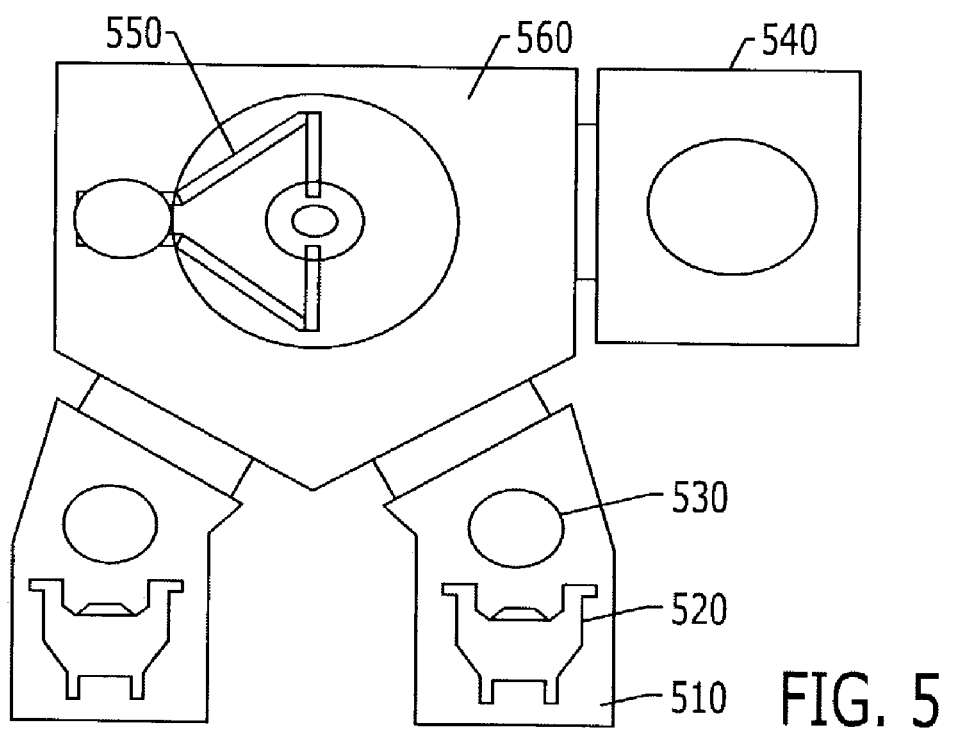
FIG. 5 illustrates a semiconductor processing apparatus that can be employed in performing methods according to embodiments of the present invention.

In some embodiments, the carbon dioxide chamber is a part of a microelectronic device processing apparatus, such as the one illustrated in FIG. 5. The apparatus includes a loadlock chamber 510 having a cassette 520 loaded with one or more semiconductor wafers 530 (a semiconductor substrate). The loadlock chamber 510 is connected to a transfer chamber 560. The transfer chamber 560 may be used to transfer the semiconductor wafer 530 from a first chamber within the apparatus to a second chamber within the apparatus. While the transfer chamber 560 as illustrated in FIG. 5 has robot arms 550 for loading and unloading the semiconductor wafer 530, it is to be understood that various means for loading and unloading the semiconductor wafer 530 may be used. As shown in FIG. 5, the transfer chamber 560 is connected to a carbon dioxide chamber 540.

In some embodiments of the present invention, a method of patterning a photoresist layer includes contacting the immersion fluid layer with an immersion rinse composition (Block 150 of FIG. 1). The contacting of the immersion fluid layer with the immersion rinse composition may be performed by various processes as will be understood by those in the art including, but not limited to, rinsing with a solvent such as CFCs, HCFCs, HFCs and FCs, or a non-molecular etchant, PFP solvent or fluoroether. In some embodiments, the contacting of the immersion fluid layer with an immersion rinse composition is performed in a carbon dioxide chamber. The carbon dioxide chamber is a chamber that can withstand the pressures and temperatures for processing with liquid or supercritical carbon dioxide, as described above. In some embodiments, the carbon dioxide chamber is on a track. When a carbon dioxide chamber is used for depositing the immersion fluid layer and a carbon dioxide chamber is used for removing the immersion fluid layer, the carbon dioxide chamber utilized for the depositing the immersion fluid layer may be the same carbon dioxide chamber utilized for removal of the immersion fluid layer or may be a different carbon dioxide chamber.

The immersion rinse composition is a composition capable of removing all or substantially all of the immersion fluid layer from the patterned photoresist layer. The immersion rinse composition may be an aqueous composition, an organic composition, or a carbon-dioxide based (e.g., comprising greater than 50 percent carbon dioxide) composition. The immersion rinse composition comprises liquid or supercritical carbon dioxide in some embodiments, as described above.

In some embodiments, the immersion rinse composition comprises liquid or supercritical carbon dioxide and a co-solvent. Exemplary co-solvents that could be used include, but are not limited to, alcohols (e.g., methanol, ethanol, and isopropanol); fluorinated and other halogenated solvents (e.g., chlorotrifluoromethane, trichlorofluoromethane, perfluoropropane, chlorodifluoromethane, and sulfur hexafluoride); amines (e.g., N-methyl pyrrolidone); amides (e.g., dimethyl acetamide); aromatic solvents (e.g., benzene, toluene, and xylenes); esters (e.g., ethyl acetate, dibasic esters, and lactate esters); ethers (e.g., diethyl ether, tetrahydrofuran, and glycol ethers); aliphatic hydrocarbons (e.g., methane, ethane, propane, ammonium butane, n-pentane, and hexanes); oxides (e.g., nitrous oxide); olefins (e.g., ethylene and propylene); natural hydrocarbons (e.g., isoprenes, terpenes, and d-limonene); ketones (e.g., acetone and methyl ethyl ketone); organosilicones; alkyl pyrrolidones (e.g., N-methylpyrrolidone); paraffins (e.g., isoparaffin); petroleum-based solvents and solvent mixtures; and any other compatible solvent or mixture that is available and suitable. Mixtures of the above co-solvents may be used.

According to still other embodiments of the present invention; a method of patterning a photoresist layer on a substrate includes depositing an immersion fluid layer onto the photoresist layer, imaging the photoresist layer to provide an imaged photoresist layer, and contacting the immersion fluid layer with an immersion rinse composition, which includes liquid or supercritical carbon dioxide, to remove the immersion fluid layer from the imaged photoresist layer.

The immersion fluid layer may be deposited on the photoresist layer as described above at Block 130. The immersion fluid layer may include various immersion fluid compounds including, but not limited to, perfluoropolyethers. In some embodiments, the immersion fluid layer is Fomblin® Y (e.g., Fomblin® Y-18 or Fomblin® Y-140) or Fomblin® Z (e.g., Fomblin® Z-25) commercially available from Solvay Solexis of Thorofare, N.J. In other embodiments, the immersion fluid layer is a perfluoropolyether or other suitable fluorinated compound layer that has been deposited utilizing carbon dioxide as described above. The immersion fluid compound and/or immersion fluid layer may have similar characteristics to one or more of the various characteristics described above with respect to immersion fluid compounds and immersion fluid layers such as transparency, freedom from optical defects, minimal or no interaction with the resist to impede image formation, compatibility with the clean room environment and the semiconductor manufacturing process, not toxic, chemically inert, resistant to damage by the radiation of interest, and/or index matched with the final optical element.

Figure 4:
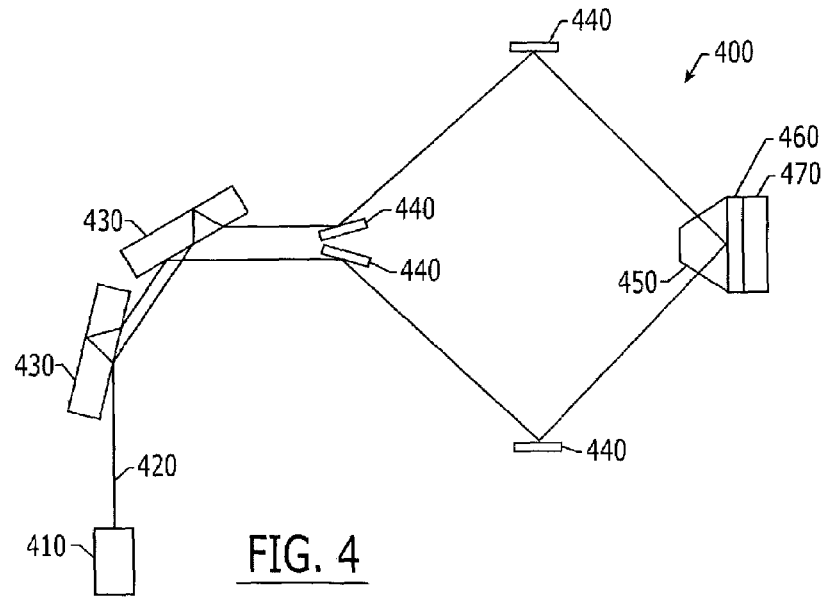
FIG. 4 illustrates an immersion interference lithography apparatus that can be employed in performing methods according to embodiments of the present invention.

After depositing the immersion fluid layer, the photoresist layer may be imaged utilizing various immersion lithography processes (Block 140). In general, "dry" (i.e., non-immersion) lithography apparatus can be converted to immersion lithography processes by, for example, introducing a layer of immersion fluid between, for example, the final optical element and the photoresist layer on the semiconductor substrate. For example, as illustrated in FIG. 4, an interference lithography system 400 will now be described. The interference lithography system 400 may be a conventional interference lithography system as will be understood by those skilled in the art with the exception that an immersion fluid layer 460 has been deposited between the final optical element 450 and the microelectronic workpiece 470, which comprises a substrate with a photoresist layer thereon, where the photoresist layer is adjacent the immersion fluid layer. In general, a radiation source 410 such as a Lambda-Physik LPX-200 $F_2$ laser emits a laser beam 420. The laser beam 420 is split into two polarized arms by partial reflection from the reflecting plates 430, which may comprise, for example, $CaF_2$. The arms are then reflected in the mirrors 440, which may comprise, for example, Si, and eventually enter the final optical element 450. The arms then pass through the immersion fluid layer 460 and intersect at the surface of the microelectronic workpiece 470. While embodiments of the present invention have been described with reference to an interference lithography system, it is to be understood that the present invention may be performed utilizing various lithography systems as will be understood by those skilled in the art including, but not limited to, projection lithography and/or contact printing lithography.

After imaging the photoresist layer, the immersion layer is removed (Block 160) by contacting the immersion layer with an immersion rinse composition as described above.

According to other embodiments of the present invention, a method of removing an immersion fluid layer from an imaged photoresist layer on a substrate includes contacting the immersion fluid layer with an immersion rinse composition comprising liquid or supercritical carbon dioxide to remove the immersion fluid layer from the imaged photoresist layer. The contacting operation, immersion fluid layer, and immersion rinse composition can be similar to those described above.

In still other embodiments, as was described above, an immersion fluid is deposited, the photoresist is imaged and the immersion fluid is rinsed off. The photoresist is developed, for example, using TMAH and/or other conventional developer. Then, the patterned photoresist is dried using $CO_2$ and/or $CO_2$ with surfactants. By using $CO_2$ and/or $CO_2$ with surfactants, image collapse can be reduced or prevented. In still other embodiments, development may take place directly using $CO_2$ for negative or positive tone images using techniques that are known to those having skill in the art.

In still other embodiments, non-$CO_2$ methods may be used for applying and removing the immersion fluid, but then $CO_2$ may be used to assist in developing the pattern in the resist, either using $CO_2$ directly to develop the pattern or using standard development methods followed by $CO_2$-based drying methods. $CO_2$ may be used to simultaneously develop the photoresist layer and remove the immersion layer in other embodiments. In still other embodiments, as was described above, the photoresist is cleaned or removed using carbon dioxide.

In still other embodiments, the immersion fluid is a polymeric film and is physically placed onto the photoresist, with or without using carbon dioxide. In still other embodiments, a liquid is placed between the polymeric film and the photoresist with or without the use of carbon dioxide.

In the specification, there has been disclosed embodiments of the invention and, although specific terms are employed, they are used in a generic and descriptive sense only and not for purposes of limitation, the scope of the invention being set forth in the following claims.

That which is claimed is:

1. A method of patterning a substrate comprising performing immersion lithography on a photoresist layer on the substrate using carbon dioxide, wherein the performing immersion lithography comprises:
   depositing a fluid layer onto the photoresist layer, the fluid layer comprising carbon dioxide and at least one immersion compound; and
   removing at least some of the carbon dioxide from the fluid layer to provide an immersion fluid layer on the photoresist layer.

2. A method according to claim 1 wherein the fluid layer comprises liquid and/or supercritical carbon dioxide.

3. A method according to claim 1 wherein the at least one immersion fluid compound comprises a fluorine and/or silicon-containing compound.

4. A method according to claim 3 wherein the fluorine and/or silicon-containing compound comprises a perfluoropolyether compound.

5. A method according to claim 1 wherein the at least one immersion fluid compound comprises a polymer.

6. A method according to claim 1 wherein the depositing a fluid layer is performed in a carbon dioxide chamber.

7. A method according to claim 6 wherein the carbon dioxide chamber comprises part of a microelectronic processing track.

8. A method of patterning a substrate comprising performing immersion lithography on a photoresist layer on the substrate using carbon dioxide, wherein the performing immersion lithography comprises:
   forming an immersion layer on the photoresist layer;
   imaging the photoresist layer through the immersion layer; and removing the immersion layer from the imaged photoresist layer by contacting the immersion layer with an immersion rinse composition comprising liquid and/or supercritical carbon dioxide.

9. A method according to claim 8, wherein the forming an immersion layer on the photoresist layer comprises:
forming an immersion layer comprising carbon dioxide on the photoresist layer.

10. A method according to claim 9 wherein the forming an immersion layer comprises:
depositing a fluid layer onto the photoresist layer, the fluid layer comprising carbon dioxide and at least one immersion fluid compound; and
removing at least some of the carbon dioxide from the fluid layer to provide the immersion layer on the photoresist layer.

11. A method according to claim 10 wherein the fluid layer comprises liquid and/or supercritical carbon dioxide.

12. A method according to claim 10 wherein the at least one immersion fluid compound comprises a fluorine and/or silicon-containing compound.

13. A method according to claim 12 wherein the fluorine and/or silicon-containing compound comprises a perfluoropolyether compound.

14. A method according to claim 10 wherein the at least one immersion fluid compound comprises a polymer.

15. A method according to claim 10 wherein the depositing a fluid layer is performed in a carbon dioxide chamber.

16. A method according to claim 15 wherein the carbon dioxide chamber comprises part of a microelectronic processing track.

17. A method of claim 9, wherein the immersion layer comprising carbon dioxide comprises liquid and/or supercritical carbon dioxide.

18. A method of patterning a substrate comprising performing immersion lithography on a photoresist layer on the substrate using carbon dioxide, wherein the performing immersion lithography comprises:
forming an immersion layer comprising carbon dioxide on the photoresist layer;
imaging the photoresist layer through the immersion layer;
removing the immersion layer from the photoresist layer; and
drying the photoresist layer from which the immersion layer has been removed using liquid and/or supercritical carbon dioxide.

19. A method according to claim 18 wherein the drying is performed in a carbon dioxide chamber.

20. A method according to claim 19 wherein the carbon dioxide chamber comprises part of a microelectronic processing track.

21. A method of patterning a substrate comprising performing immersion lithography on a photoresist layer on the substrate using carbon dioxide, wherein the performing immersion lithography comprises:
forming an immersion layer comprising carbon dioxide on the photoresist layer;
imaging the photoresist layer through the immersion layer;
removing the immersion layer from the photoresist layer; and
developing the photoresist layer from which the immersion layer has been removed using liquid and/or supercritical carbon dioxide.

22. A method according to claim 21 wherein the developing is performed in a carbon dioxide chamber.

23. A method according to claim 22 wherein the carbon dioxide chamber comprises part of a microelectronic processing track.

24. A method of patterning a substrate comprising performing immersion lithography on a photoresist layer on the substrate using carbon dioxide, wherein the performing immersion lithography comprises:
forming an immersion layer on the photoresist layer;
imaging the photoresist layer through the immersion layer; and
removing the immersion layer from the photoresist layer and simultaneously developing the photoresist layer using liquid and/or supercritical carbon dioxide.

25. A method according to claim 24 wherein the removing and simultaneously developing is performed in a carbon dioxide chamber.

26. A method according to claim 25 wherein the carbon dioxide chamber comprises part of a microelectronic processing track.

27. A method according to claim 24, wherein the forming an immersion layer on the photoresist layer comprises:
forming an immersion layer comprising carbon dioxide on the photoresist layer.

28. A method according to claim 27, wherein the removing and simultaneously developing is performed in a carbon dioxide chamber.

29. A method according to claim 28, wherein the carbon dioxide chamber comprises part of a microelectronic processing track.

30. A method of patterning a substrate comprising performing immersion lithography on a photoresist layer on the substrate using carbon dioxide, wherein the performing immersion lithography comprises:
placing a solid immersion film on the photoresist layer; and
imaging the photoresist layer through the solid immersion film.

31. A method according to claim 30 wherein the placing a solid immersion film on the photoresist layer comprises:
placing a solid immersion film comprising carbon dioxide and at least one solid immersion film compound on the photoresist layer; and
removing the carbon dioxide from the solid immersion film.

32. A method according to claim 30 wherein the placing a solid immersion film on the photoresist layer is preceded by placing an immersion fluid layer on the photoresist layer and wherein the placing a solid immersion film on the photoresist layer comprises placing a solid immersion film on the immersion fluid layer opposite the photoresist layer.

33. A method according to claim 32 wherein the placing an immersion fluid layer comprises:
depositing a fluid layer onto the photoresist layer, the fluid layer comprising carbon dioxide and at least one immersion compound; and
removing at least some of the carbon dioxide from the fluid layer to provide an immersion fluid layer on the photoresist layer.

34. A method according to claim 33 wherein the fluid layer comprises liquid and/or supercritical carbon dioxide.

35. A method according to claim 33 wherein the at least one immersion fluid compound comprises a fluorine and/or silicon-containing compound.

36. A method according to claim 35 wherein the fluorine and/or silicon-containing compound comprises a perfluoropolyether compound.

37. A method according to claim 33 wherein the at least one immersion fluid compound comprises a polymer.

38. A method according to claim 33 wherein the depositing a fluid layer is performed in a carbon dioxide chamber.

39. A method according to claim 38 wherein the carbon dioxide chamber comprises part of a microelectronic processing track.

40. A method of patterning a substrate comprising:
placing an immersion fluid layer on a photoresist layer on a substrate;
placing a solid immersion film on the immersion fluid layer opposite the photoresist layer; and
imaging the photoresist layer through the immersion fluid layer and the solid immersion film that were placed on the photoresist layer.

41. A method according to claim 40 wherein the placing an immersion fluid layer comprises:
depositing a fluid layer onto the photoresist layer, the fluid layer comprising carbon dioxide and at least one immersion compound; and
removing at least some of the carbon dioxide from the fluid layer to provide an immersion fluid layer on the photoresist layer.

42. A method according to claim 41 wherein the fluid layer comprises liquid and/or supercritical carbon dioxide.

43. A method according to claim 41 wherein the at least one immersion fluid compound comprises a fluorine and/or silicon-containing compound.

44. A method according to claim 43 wherein the fluorine and/or silicon-containing compound comprises a perfluoropolyether compound.

45. A method according to claim 41 wherein the at least one immersion fluid compound comprises a polymer.

46. A method according to claim 41 wherein the depositing a fluid layer is performed in a carbon dioxide chamber.

47. A method according to claim 46 wherein the carbon dioxide chamber comprises part of a microelectronic processing track.

* * * * *

UNITED STATES PATENT AND TRADEMARK OFFICE
CERTIFICATE OF CORRECTION

PATENT NO. : 7,029,832 B2
APPLICATION NO. : 10/386356
DATED : April 18, 2006
INVENTOR(S) : Rolland et al.

It is certified that error appears in the above-identified patent and that said Letters Patent is hereby corrected as shown below:

On the Title Page:

Item (73)    Assignee should be: The University of North Carolina at Chapel Hill Signed and Sealed this Sixth Day of March, 2007

JON W. DUDAS
*Director of the United States Patent and Trademark Office*